(12) United States Patent
Lin et al.

(10) Patent No.: US 8,617,963 B2
(45) Date of Patent: Dec. 31, 2013

(54) INTEGRATED CIRCUIT WAFER DICING METHOD

(75) Inventors: Ching-San Lin, Wufeng Township, Taichung County (TW); Kun-Tai Wu, Zhubei (TW); Chih-Chao Wang, Zhubei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 277 days.

(21) Appl. No.: 13/168,141

(22) Filed: Jun. 24, 2011

(65) Prior Publication Data

US 2012/0003817 A1    Jan. 5, 2012

(30) Foreign Application Priority Data

Jul. 1, 2010    (TW) ................................ 99121747 A

(51) Int. Cl.
*H01L 21/82*    (2006.01)
(52) U.S. Cl.
USPC ................................. 438/462; 257/E21.602

(58) Field of Classification Search
USPC ........................................................ 438/462
See application file for complete search history.

(56) References Cited

U.S. PATENT DOCUMENTS

2008/0286938 A1*    11/2008    Pu et al. ......................... 438/458

OTHER PUBLICATIONS

Stanley Wolf Ph.D. and Richard N. Tauber Ph.D., Silicon Processing for the VLSI Era, 1986, Lattice Press, vol. I, pp. 407-409, 415, and 416.*

* cited by examiner

*Primary Examiner* — Alexander Ghyka
*Assistant Examiner* — Stanetta Isaac

(57) ABSTRACT

An integrated circuit wafer dicing method is provided. The method includes forming a plurality of integrated circuits and a plurality of test-keys on a wafer substrate, wherein the plurality of test-keys are disposed between the adjacent integrated circuits; forming a patterned protective film on the wafer to cover the plurality of integrated circuits and expose the plurality of test-keys; etching the plurality of test-keys by using the patterned protective film as a mask; and dicing an area between the plurality of integrated circuits to form a plurality of discrete integrated circuit dies.

5 Claims, 7 Drawing Sheets

INTEGRATED CIRCUIT WAFER DICING METHOD

BACKGROUND OF THE INVENTION

1. Field of the Invention

This invention generally relates to an integrated circuit wafer dicing method, wherein a plurality of integrated circuit dies are formed from an integrated circuit wafer by the integrated circuit wafer dicing method.

2. Description of the Prior Art

A wafer is a substrate for manufacturing integrated circuits. Using integrated circuit fabrication technology, through a series of complicated chemical, physical, and optical processes, a fabricated integrated circuit wafer can include thousands or hundreds of integrated circuit dies. After being tested, cut, and packaged, these dies can be formed into various integrated circuit products having different functions.

FIG. 1 shows a conventional integrated circuit wafer 900 and an enlarge view of the area 80; FIG. 2 shows a cross-sectional view of the area 80 of FIG. 1 indicated by PP. As shown in FIGS. 1 and 2, the conventional integrated circuit wafer 900 includes a wafer substrate 100, a plurality of integrated circuits 300, and a plurality of test-keys 400. In a conventional wafer dicing process, an external force K is applied by a cutter to the integrated circuit wafer 900 along a path between two adjacent integrated circuits 300. Because the cutter is directly applied onto the integrated circuit wafer 900, cracks and damages of the integrated circuit wafer 900 will be produced due to the dicing stress. On the other hand, the test-keys 400 are distributed between the integrated circuits 300, i.e. on the dicing path. Therefore, the yield rate will be decreased due to metal ashes generated from the cutting of test-keys during the dicing process. Therefore, it is desired to improve the conventional dicing method.

SUMMARY

It is an object of the present invention to provide an integrated circuit wafer which can be separated into multiple integrated circuit dies with improved yield rate.

The method includes forming a plurality of integrated circuits and a plurality of test-keys on a wafer substrate, wherein the test-keys are respectively disposed between the adjacent integrated circuits; forming a patterned protective layer on the integrated circuits, wherein the patterned protective layer covers the integrated circuits and exposes the test-keys; etching to remove the test-keys by using the patterned protective layer as a mask; and dicing an area between the adjacent integrated circuits to form a plurality of discrete integrated circuit dies. The plurality of test-keys are used for wafer acceptance test. The plurality of test-keys include a transistor, a capacitor, a resistor, an n-type semiconductor, a p-type semiconductor, a p-n-type semiconductor, a metal wire component, or a combination thereof.

The patterned protective layer is a patterned photoresist layer. The step of forming the patterned protective layer includes: covering the wafer substrate with a photoresist layer; exposing the photoresist layer by using a photomask; and developing the exposed photoresist layer to form the patterned protective layer. The step of etching can be dry etching or wet etching. The etching step further includes forming a plurality of grooves at the locations of the test-keys, wherein the dicing step further includes dicing along the grooves. The integrated circuits are disposed on the wafer substrate in matrix.

DETAILED DESCRIPTION OF THE PREFERRED EMBODIMENT

Figure 3:
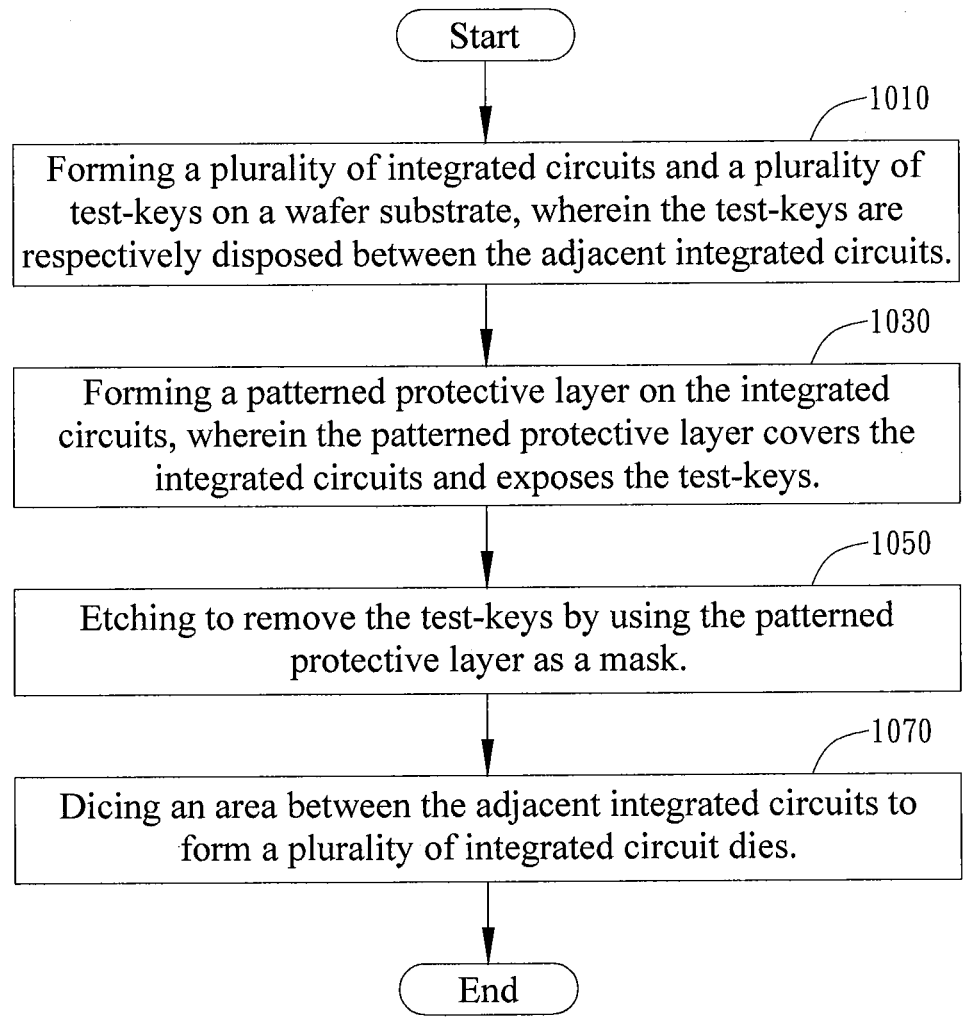
FIG. 3 is a flow chart of the integrated circuit wafer dicing method of the present invention.

As shown in FIG. 3, the integrated circuit wafer dicing method of the present invention includes the following steps.

Figure 1:
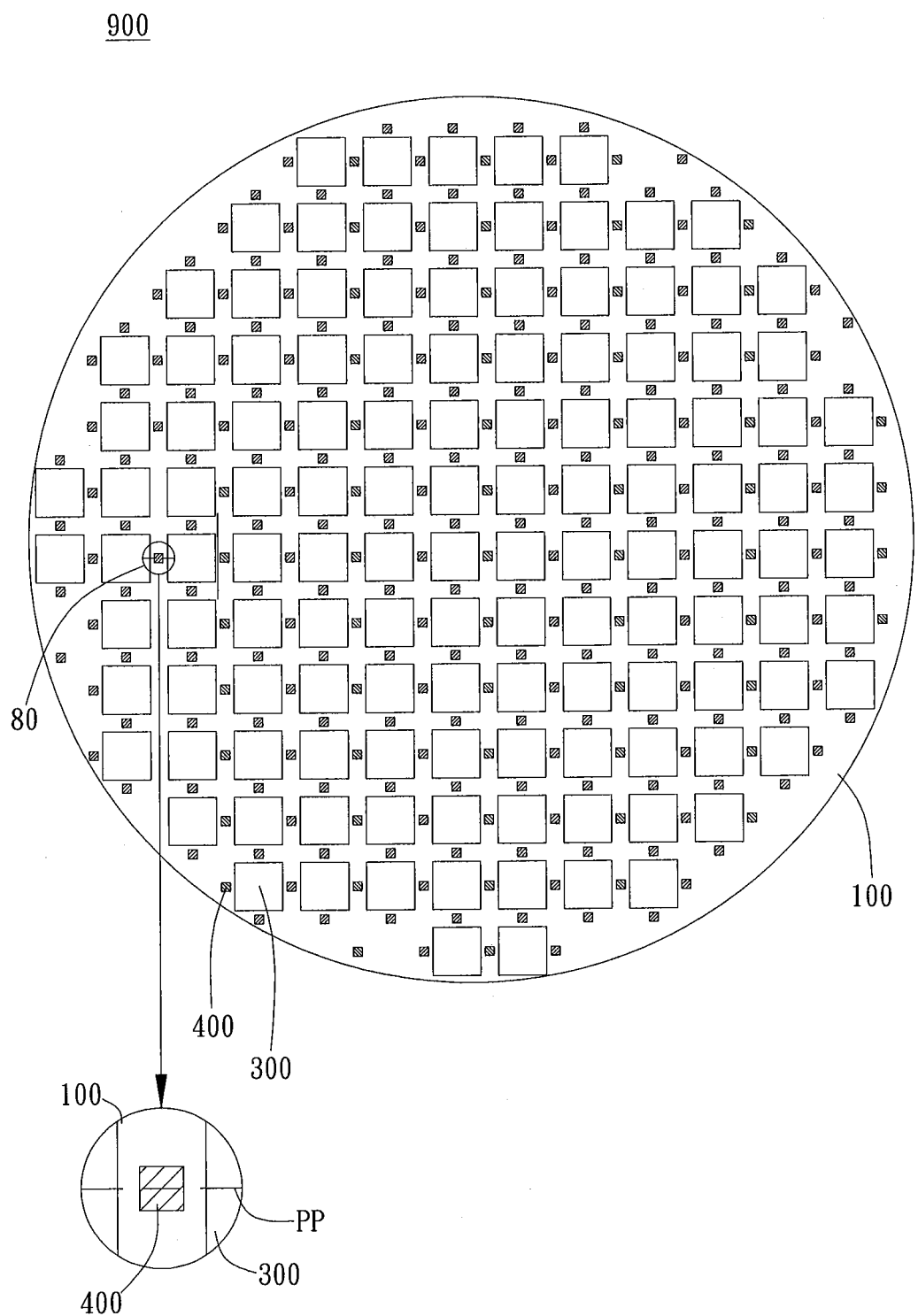
FIGS. 1 and 2 are schematic views of the prior art.
Figure 2:
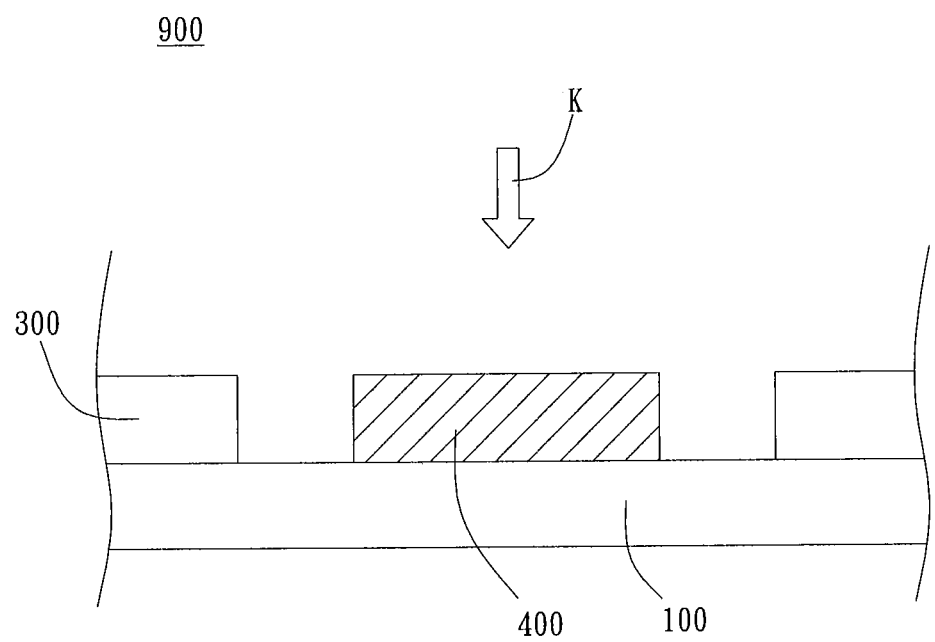

Step 1010, the step of forming a plurality of integrated circuits and a plurality of test-keys on a wafer substrate is performed, wherein the test-keys are respectively disposed between the adjacent integrated circuits. More particularly, as shown in FIGS. 1 and 2 which is a cross sectional view of area 80 of FIG. 1 indicated by PP, the integrated circuits 300 and the test-keys 400 are formed on the wafer substrate 100 by semiconductor processing steps such as deposition, photolithography, etching, thermal processes, etc. The locations where the integrated circuits 300 and the test-keys 400 are formed can be controlled by the patterns of a mask. The integrated circuits 300 are disposed on the wafer substrate 100 in matrix. More particularly, as shown in FIG. 1, a unit square represents one integrated circuit 300 on the wafer substrate 100, wherein the integrated circuits 300 are aligned and arranged in matrix for manufacturing and dicing. However, the shape and the arrangement of the integrated circuits 300 are not limited to the above embodiment. For example, the integrated circuits 300 can have rectangular or any suitable geometric shape and arranged in any manner as appropriate.

The test-keys 400 are respectively formed between adjacent integrated circuits 300. More particularly, the test-keys 400 are disposed on a dicing path, wherein the dicing path is defined as a path for dicing the wafer substrate 100 to form a plurality of discrete dies of integrated circuits 300. The plurality of test-keys 400 are used for wafer acceptance test. More particularly, the acceptance of the wafer substrate 100, i.e. the quality of the wafer substrate 100, can be obtained by carrying out electrical tests onto the plurality of test-keys 400 distributed on the wafer substrate 100 before dicing the wafer substrate 100. The plurality of test-keys 400 may include transistors, capacitors, resistors, n-type semiconductors, p-type semiconductors, p-n-type semiconductors, metal wire components, etc. Moreover, the test-keys 400 can include a combination of devices described above.

Figure 4A:
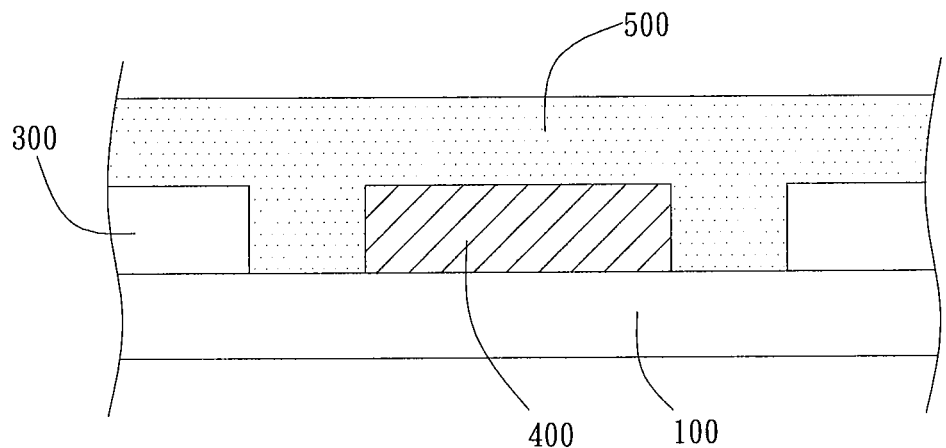
FIGS. 4A to 5 are schematic views of forming the patterned protective layer in preferred embodiments of the present invention.
Figure 4B:
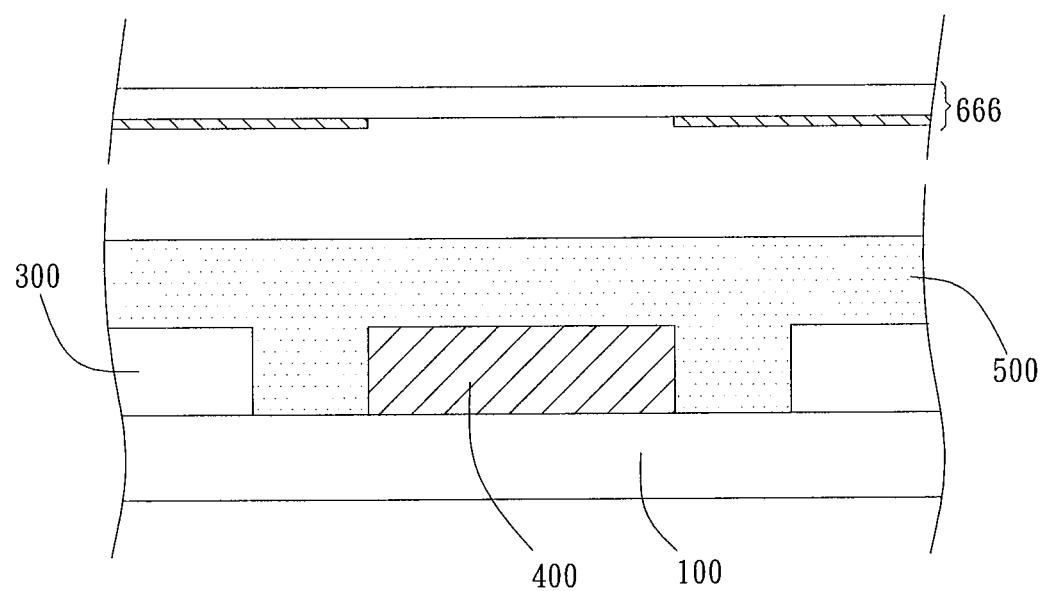
Figure 5:
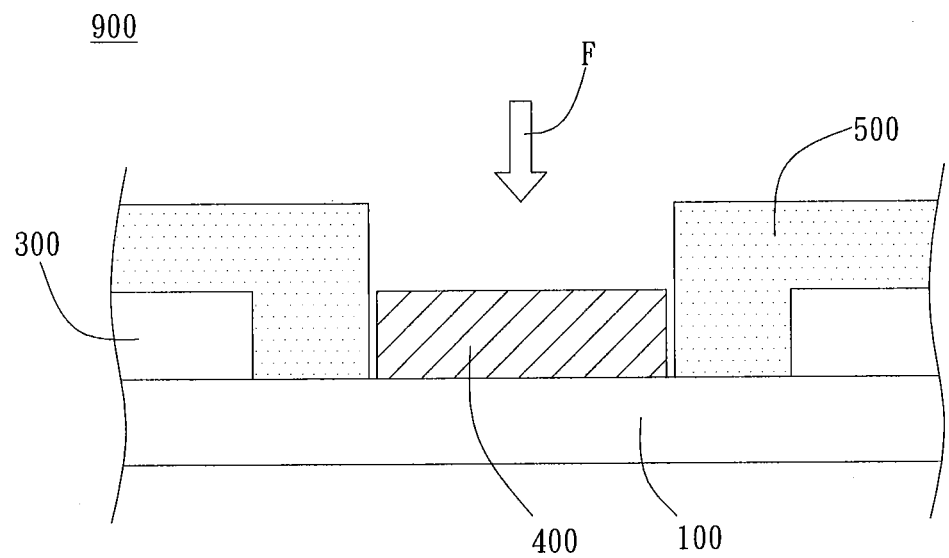

Step 1030, the step of forming a patterned protective layer on the integrated circuits is performed, wherein the patterned protective layer covers the integrated circuits and exposes the test-keys. More particularly, the patterned protective layer is a patterned photoresist layer. The step of forming the patterned protective layer includes: covering the wafer substrate with a photoresist layer; exposing the photoresist layer by using a photomask; and developing the exposed photoresist layer to form the patterned protective layer. More particularly, the step of forming the patterned protective layer includes: covering the wafer substrate 100 with the photoresist layer 500 as shown in FIG. 4A; exposing the photoresist layer 500 by using the photomask 666 as shown in FIG. 4B; and developing the exposed photoresist layer 500 to form a developed photoresist layer 500 as shown in FIG. 5, wherein the developed photoresist layer 500 is the patterned protective layer. The photoresist layer 500 shown in FIG. 4A is preferably a blanket layer covering the entire wafer substrate 100 including the integrated circuits 300 and the test-keys 400 by spin coating. The patterned protective layer shown in FIG. 5 covers the integrated circuits 300 and exposes the test-keys 400.

Step 1050, the step of etching to remove the test-keys by using the patterned protective layer as a mask is performed. More particularly, the test-keys 400 shown in FIG. 5 is etched through by a dry plasma etching process or a wet chemical etching process to form an integrated circuit wafer 900 shown in FIG. 6A.

Figure 6A:
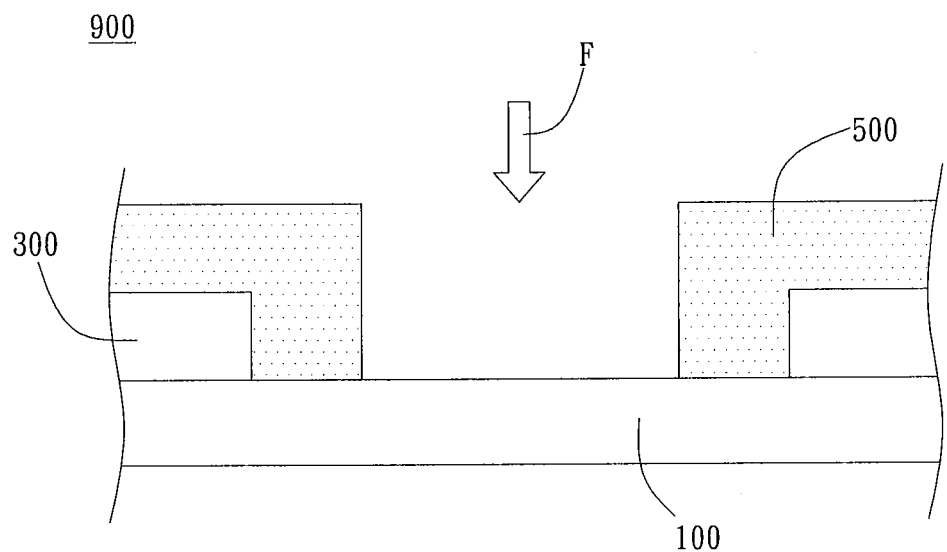
FIGS. 6A and 6B are schematic views of the preferred embodiment of the present invention showing that the test-keys have been removed.

Step 1070, the step of dicing an area between the adjacent integrated circuits to form a plurality of integrated circuit dies is performed. More particularly, as shown in FIG. 6A, an external force F is applied to an area between the two adjacent integrated circuits 300 to separate the wafer substrate 100 into a plurality of discrete integrated circuit dies. The external force F can be applied by a cutting tool. Since the test-keys (shown in FIG. 5) are removed in step 1050, the present invention can solve the problem of yield rate decreasing caused by metal ashes, wherein the metal ashes are produced from cutting and damaging the test-key during dicing in the prior art.

Figure 6B:
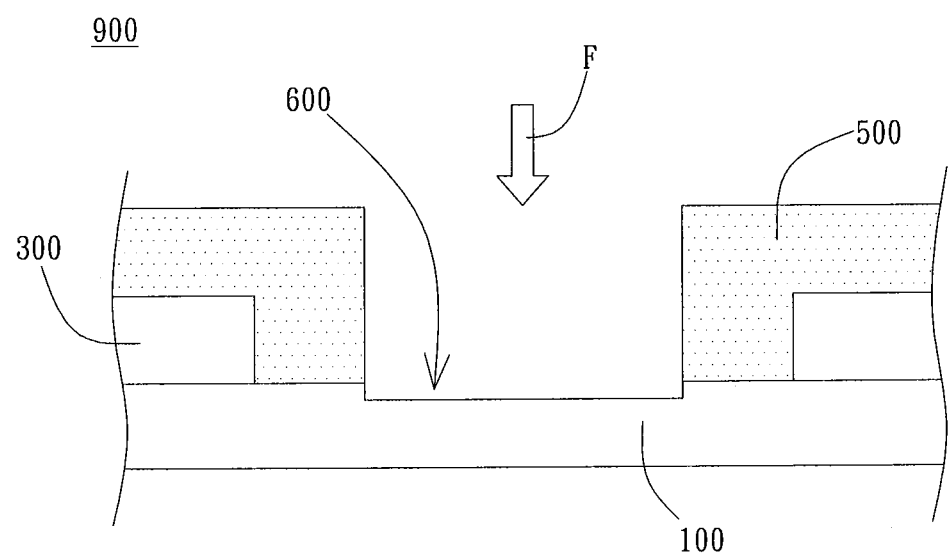

In another embodiment, step 1050 further includes forming a plurality of grooves at the locations of the test-keys, wherein the dicing step further comprising dicing along the grooves. More particularly, by controlling the conditions of etching process such as the time of etching or the concentration of etching solutions, the grooves 600 shown in FIG. 6B can further be formed by etching during the removal of the test-keys 400. Since the thickness of the wafer substrate 100 is thinner at the location of the grooves 600, step 1070 can further include dicing along the grooves for more swimmingly.

Figure 7:
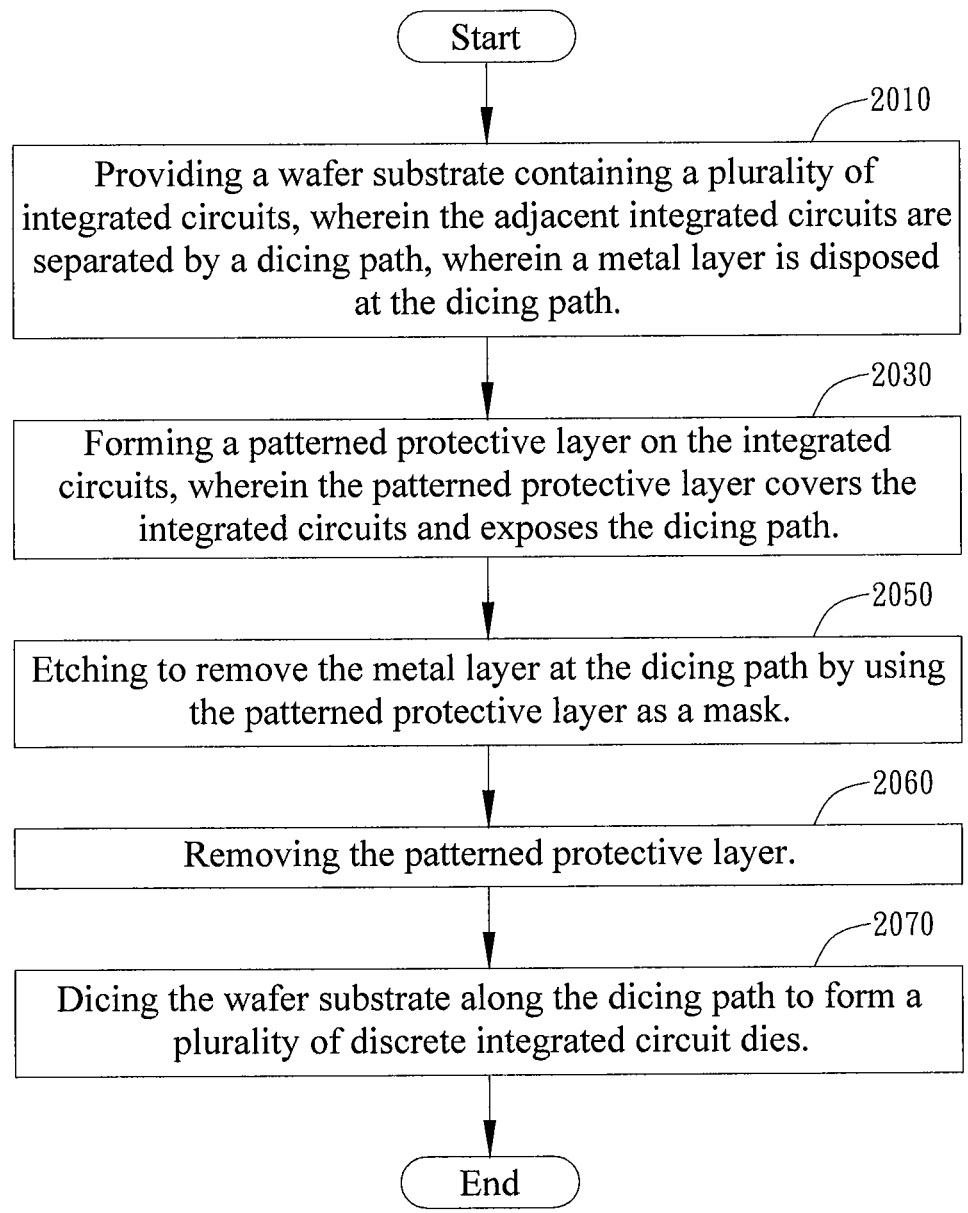
FIG. 7 is a flow chart of the integrated circuit wafer dicing method of a different embodiment of the present invention.

As shown in FIG. 7, taking a different point of view, the integrated circuit wafer dicing method of the present invention includes the following steps.

Step 2010, the step of providing a wafer substrate containing a plurality of integrated circuits is performed, wherein the adjacent integrated circuits are separated by a dicing path, wherein a metal layer is disposed at the dicing path. The metal layer is preferably but not limited to a test-key.

Step 2030, the step of forming a patterned protective layer on the integrated circuits is performed, wherein the patterned protective layer covers the integrated circuits and exposes the dicing path. In the preferred embodiment, the patterned protective layer is formed by using a photoresist layer. The patterned protective layer exposes the test-keys.

Step 2050, the step of etching to remove the metal layer at the dicing path by using the patterned protective layer as a mask is performed. In the preferred embodiment, the test-keys are etched to be removed.

Step 2070, the step of dicing the wafer substrate along the dicing path to form a plurality of discrete integrated circuit dies is performed.

In the preferred embodiment, the method further includes step 2060, the step of removing the patterned protective layer, after step 2050. More particularly, the patterned protective layer is removed by etching before step 2070.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An integrated circuit wafer dicing method, comprising:
   forming a plurality of integrated circuits and a plurality of test-keys on a wafer substrate, wherein the test-keys are respectively disposed between the adjacent integrated circuits;
   forming a patterned protective layer on the integrated circuits, wherein the patterned protective layer covers the integrated circuits and exposes the test-keys;
   etching to remove the test-keys and to form a plurality of grooves at the locations of the test-keys by using the patterned protective layer as a mask, wherein the grooves have no contact with the integrated circuits; and
   dicing along the grooves to form a plurality of integrated circuit dies.

2. The integrated circuit wafer dicing method of claim 1, wherein the patterned protective layer is a patterned photoresist layer.

3. The integrated circuit wafer dicing method of claim 2, wherein the step of forming the patterned protective layer includes:
   covering the wafer substrate with a photoresist layer;
   exposing the photoresist layer by using a photomask; and
   developing the exposed photoresist layer to form the patterned protective layer.

4. The integrated circuit wafer dicing method of claim 1, wherein the step of etching is dry etching.

5. The integrated circuit wafer dicing method of claim 1, wherein the step of etching is wet etching.

* * * * *